United States Patent [19]

Chadwick

[11] Patent Number: 5,493,257
[45] Date of Patent: Feb. 20, 1996

[54] MODULATOR WITH BIASING CIRCUIT TO MINIMIZE OUTPUT DISTORTION

[75] Inventor: Peter E. Chadwick, Wiltshire, United Kingdom

[73] Assignee: Plessey Semiconductors Limited, Wiltshire, United Kingdom

[21] Appl. No.: 295,017

[22] Filed: Aug. 24, 1994

[30] Foreign Application Priority Data

Sep. 28, 1993 [GB] Great Britain ............ 9319954

[51] Int. Cl.$^6$ ............ H03C 3/00; H03C 3/09; H03B 5/08; H03L 7/08
[52] U.S. Cl. ............ 332/100; 332/127; 331/17; 331/23; 331/36 C; 331/177 V
[58] Field of Search ............ 332/100, 127, 332/128; 331/17, 23, 36 C, 117 R, 117 FE, 117 D, 177 V

[56] References Cited

U.S. PATENT DOCUMENTS 4,609,886  9/1986  Takaki et al. ............ 375/44 X
4,633,197  12/1986  Vanderspool, II ............ 332/127 X

FOREIGN PATENT DOCUMENTS 2046541A  11/1980  United Kingdom .

*Primary Examiner*—David Mis
*Attorney, Agent, or Firm*—Lowe, Price, LeBlanc & Becker

[57] ABSTRACT

A modulator for digital modulation is described to produce a modulated output from a voltage controlled oscillator in a phase locked loop during transmission of a random modulating input. The input voltage is applied to a coupling capacitor and when transmission ceases, the state of charge on the capacitor will not change because of a biasing circuit which comprises two resistors fed by a tri-state buffer which holds the input terminal of the capacitor at the average level between logic zero and logic one when no modulation is applied.

3 Claims, 2 Drawing Sheets

1

MODULATOR WITH BIASING CIRCUIT TO MINIMIZE OUTPUT DISTORTION

BACKGROUND OF THE INVENTION

1. Field of the Invention

This invention relates to modulators, especially to modulators for applying digital modulation to generate modulated data outputs, for example, for use in transceivers (transmitters/receivers) for use with a local area network.

2. Description of the Prior Art

Modulators employing a voltage controlled oscillator in a phase locked loop are used for producing a frequency modulated output e.g. of analogue signals such as speech. Such modulators are also employed for modulating digital data.

For example, such a modulator is shown in FIG. 1. In the absence of a modulating input applied to modulation means 1 i.e. if a continuous input of digital state 0 or digital state 1 is applied, the output of the voltage controlled oscillator 2 is held to $N.F_{ref}$ where N is the ratio of a divider 3 and $F_{ref}$ is a reference frequency produced by a crystal oscillator. Any difference between the output and $N.F_{ref}$ results in an error signal from a phase detector 4 which is fed as an input to the voltage controlled oscillator in a sense to reduce that difference. A low pass filter 5 removes noise generated at the voltage controlled oscillator, while allowing desired modulation frequencies (outside the bandwidth of the low pass filter 5) to modulate the output. The pass band should be as wide as possible to remove as much noise as possible, yet not so wide as to remove any low frequency component of the digital modulating signal which, in the case of some digital signals e.g. N.R.Z. (non-return to zero) can be considerable.

A problem with such a modulator arises in the case of a transceiver. Referring to FIG. 2, when the data consists of random 0 and 1 states the loop constrains the average frequency to be $N.F_{ref}$ (shown dotted). During a period of reception, assuming that modulating input remains (say) at digital state 0, the modulating output drifts over a period of time, from the frequency corresponding to digital state 0 to the frequency $N.F_{ref}$. The output of course is not transmitted by the transceiver. The drift is faster the greater the loop bandwidth. The problem arises when transmission recommences (FIG. 4). When the data logic state 1 is applied, the instantaneous output frequency will shift by the total modulation bandwidth and will thus exceed the frequency value corresponding to digital state 1. It will then drift back to frequency values centred about $N.F_{ref}$. The same applies if logic state 1 was applied during receive periods, and retransmission commences with data logic state 0.

SUMMARY OF THE INVENTION

The invention provides a modulator comprising modulating means for applying digital modulation to a voltage controlled oscillator in a phase locked loop, via a coupling capacitor, to generate a modulated output, the modulating means including a biassing circuit to maintain the voltage on the coupling capacitor, when no modulation is applied, at the average value on the capacitor when random modulation is applied, thereby minimizing distortion of the output when modulation is applied.

With such an arrangement, the correct frequency values are produced as soon as transmission recommences.

DESCRIPTION OF THE PREFERRED EMBODIMENT

A modulator for digital modulation in a radio transceiver for use in a LAN (local area network) will now be described by way of example with reference to FIG. 5 of the accompanying drawing, which shows a part of the circuit of the modulator.

Figure 1:
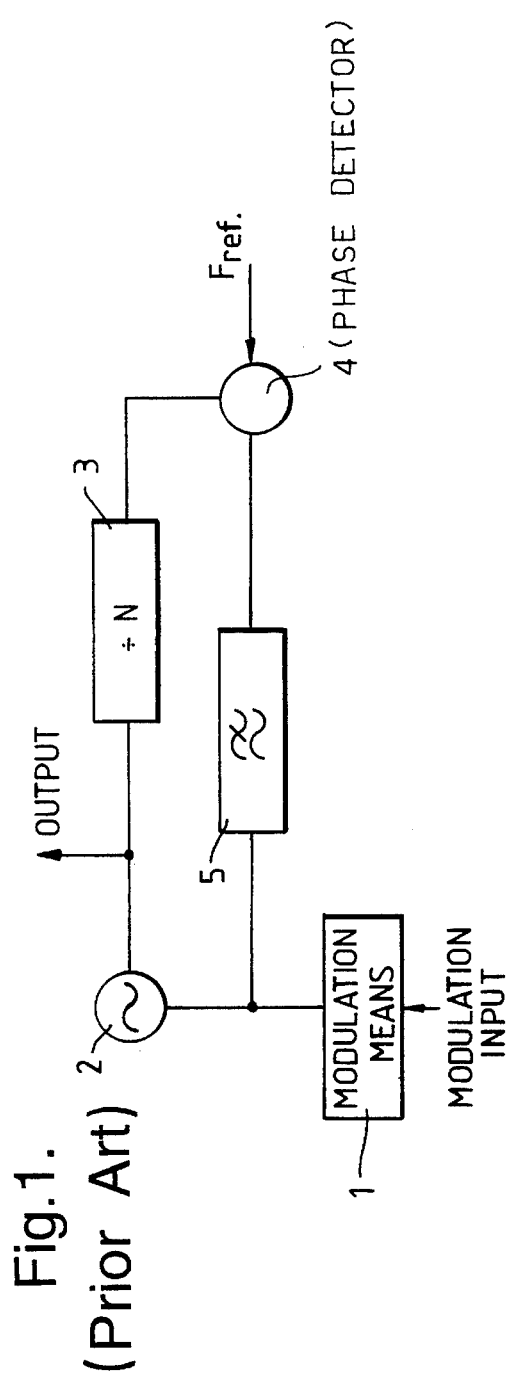
FIG. 1 is a circuit diagram of a prior art modulator.

The modulator is of the general form shown in FIG. 1. The modulated output provides the drive for a power amplifier and antenna, which are not shown. Similarly, the receive circuits are not shown. The radio transceiver is connected to the LAN by a suitable transceiver. The signal to be transmitted is applied to modulation means 1, and generates a frequency modulated output from a voltage controlled oscillator 2 in a phase locked loop, which includes a divider 3, a low pass filter 5 to suppress noise from the voltage controlled oscillator, and a phase detector 4, which receives one input from a crystal oscillator set at $F_{ref}$.

Figure 5:
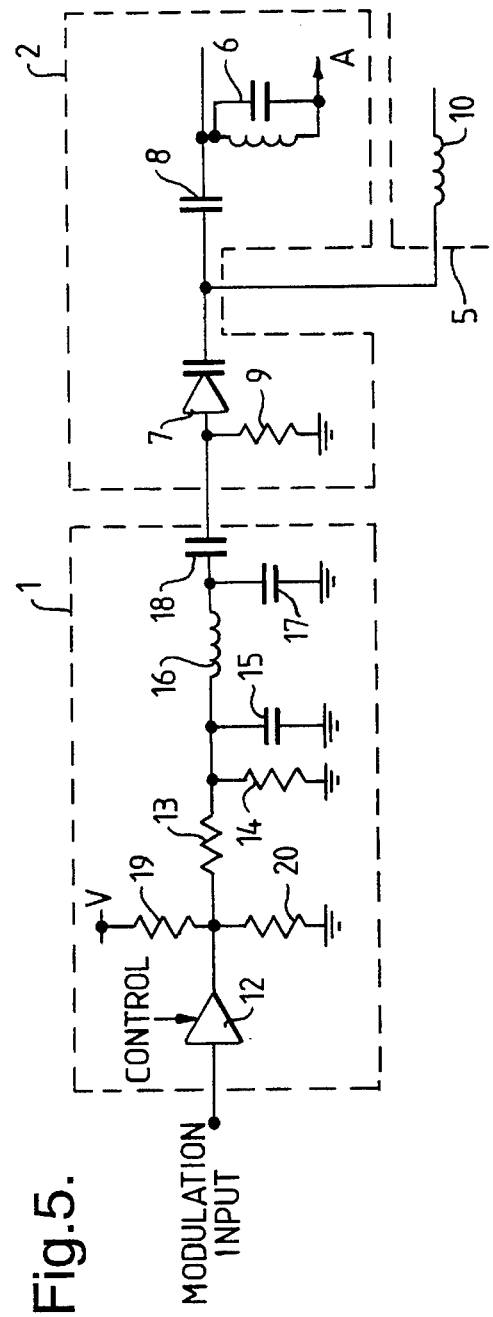
FIG. 5 is a circuit diagram of the modulator of this invention.
Figure 2:
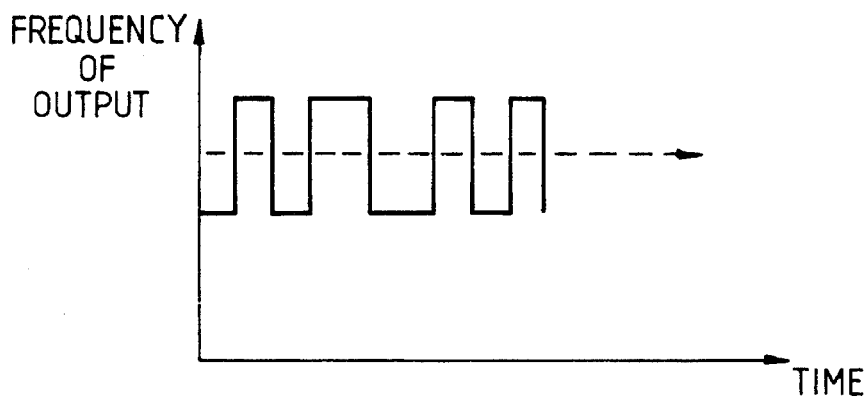
FIG. 2 is a graph depicting output versus time of a prior art modulator.
Figure 3:
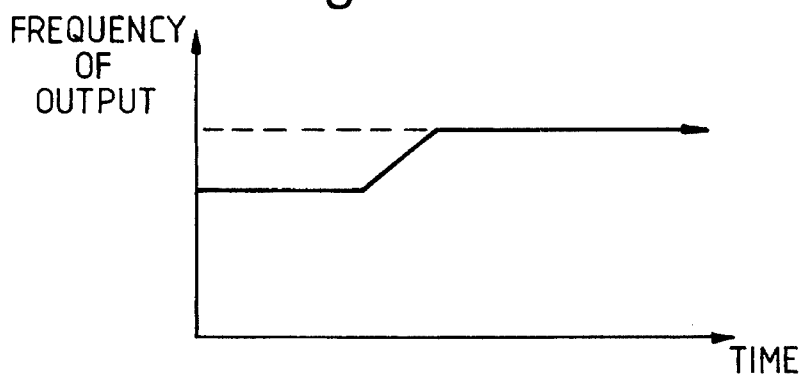
FIG. 3 is a graph depicting frequency of output versus time for prior art modulator illustrating drift during a period of reception for a transceiver.
Figure 4:
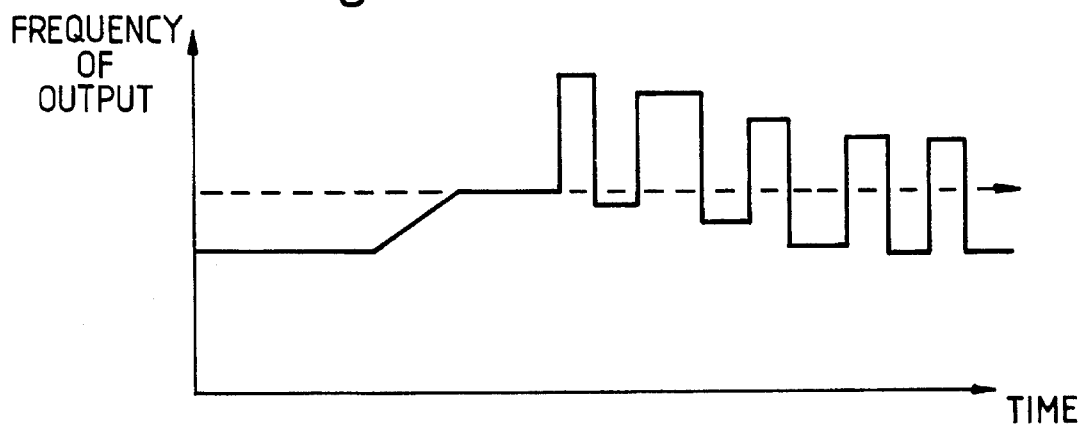
FIG. 4 is a graph depicting output over time illustrating drift when output transmission from the transceiver of FIG. 3 recommences.

Referring to FIG. 5, the circuit of the modulation means, and part of the voltage controlled oscillator are shown in more detail. As is known, the voltage controlled oscillator includes a tuned circuit 6 which in turn connects to an oscillation maintaining circuit A. The tuned circuit 6 is connected to a varactor diode 7 via a coupling capacitor 8. The varactor is connected to resistor 9 for setting the d.c. level at one terminal of the varactor diode, to vary the frequency of oscillation of the tuned circuit 6 and hence of the voltage controlled oscillator.

The other terminal of the varactor diode 7 is supplied via an r.f. choke 10 at the output of the loop filter 5. Thus, the capacitance of the varactor diode is responsive to a.c. signals from the modulation means and from the loop via the low pass filter.

The modulations e.g. data to be transmitted, are fed to buffer 12, and the appropriate portion of the output of the buffer is fed from voltage divider 13, 14, via an LC filter 15-17 and a coupling capacitor 18 to one terminal of the varactor diode 7, to produce a frequency modulated output from the voltage controlled oscillator 2. The filter 15-17 may be omitted if desired..

The circuit described so far is known.

In accordance with the invention, the modulation means includes a biassing circuit comprising resistors 19, 20, and the buffer 12 is a tri-state device which, in addition to supplying output voltage levels corresponding to logic 1 and logic 0, as for the buffer in previously known modulators, can also be set to a high impedance condition on application of a suitable control input, in which the buffer output is effectively open circuit with respect to the logic 1 and logic 0 voltage rails.

The resistors 19, 20 are made equal so that, when the tri-state device is set to its high impedance condition, the voltage at the junction of the resistors 19, 20 is midway between the voltage levels for logic 0 and logic 1. Thus, when the modulator is in a receive condition and the modulation input is set continuously at logic level 0 or logic level 1, the control input on the buffer is set to high impedance, and the voltage at the junction of the resistors is set to a level midway between that corresponding to logic 0 and logic 1 voltage levels.

When the modulator is next set to a transmit condition, the voltage swing at the junction of the resistors 19, 20 corresponds to half the total swing between logic 0 and logic 1 voltage levels. The voltage swing at the terminal of the capacitor 18 connected to the filter also undergoes a swing from a voltage corresponding to halfway between that for the two logic levels, and the voltage corresponding to whatever logic level the transmission begins with. This voltage swing is transferred to the other terminal of the capacitor and thus the varactor diode. The impedance represented by the resistors 19, 20 is high enough to have negligible effects on the output voltage of the buffer, in logic states 0, 1.

The operation of previous modulators which were not provided with the biassing circuit or the tri-state device can be understood by remembering that the capacitor 18 is a block to d.c. Thus, the d.c. components of voltage may be different on each side of the capacitor. The voltage on the input terminal of the capacitor 18 may be regarded as an a.c. component and a d.c. component combined. The a.c. component of voltage is passed by the capacitor: the d.c. component is not. When the modulator is transmitting, the voltage on the input terminal consists of a d.c. component with the a.c. data superimposed on it. The latter in effect adds a further d.c. component equal to half the swing between the logic voltage levels. When the modulator is receiving (via the receiver which is not shown) the modulator input maintains a constant logic 0 or logic 1 level, and the further d.c. component either discharges (in the case of logic 0) or charges (in the case of logic 1) via the resistor 9. Then, when transmission recommences, when data at the opposite logic level is transmitted, the voltage excursion at the input terminal of the capacitor is the full swing from logic level 0 to logic level 1 (or vice versa). With the biassing circuit and tristate device, the excursion is the desired swing from the bias level of half the swing between voltage levels and the relevant data level to be transmitted.

Of course variations may be made without departing from the scope of the invention. Thus, the invention is applicable to the situation where the data rate is an appreciable fraction of the loop bandwidth, in which case the output will not be frequency modulated but will be phase modulated. Inductor 13 may be replaced by a resistor. Equally, resistors 13, 14, 20 may be replaced by complex impedances.

Finally, although the invention has been described in relation to a transceiver with alternate transmission and reception, the invention is applicable to any synthesizer employing a voltage controlled oscillator in a phase locked loop wherein transmission is intermittent.

I claim:

1. A modulator comprising modulating means for applying digital modulation to a voltage controlled oscillator in a phase locked loop, via a coupling capacitor, to generate a modulated output, the modulating means including a biassing circuit to maintain the voltage on the coupling capacitor, when no modulation is applied, at the average value on the capacitor when random modulation is applied, thereby minimizing distortion of the output when modulation is applied.

2. A modulator as claimed in claim 1, in which the biassing circuit comprises a pair of series resistors for connection to voltage levels so that the junction of the resistors provides a bias voltage for the coupling capacitor.

3. A modulator as claimed in claim 1, including a tri-state buffer for feeding the digital modulation to the biassing circuit.

* * * * *